(12) United States Patent
Deo et al.

(10) Patent No.: US 11,530,694 B2
(45) Date of Patent: Dec. 20, 2022

(54) MODULE FOR A VACUUM PUMPING AND/OR ABATEMENT SYSTEM

(71) Applicant: Edwards Limited, Burgess Hill (GB)

(72) Inventors: Hammond Deo, Burgess Hill (GB); Helen Shaw, Burgess Hill (GB); Craig Leonard Sands, Burgess Hill (GB)

(73) Assignee: Edwards Limited, Burgess Hill (GB)

( * ) Notice: Subject to any disclaimer, the term of this patent is extended or adjusted under 35 U.S.C. 154(b) by 88 days.

(21) Appl. No.: 16/762,044

(22) PCT Filed: Nov. 9, 2018

(86) PCT No.: PCT/GB2018/053244
§ 371 (c)(1),
(2) Date: May 6, 2020

(87) PCT Pub. No.: WO2019/092430
PCT Pub. Date: May 16, 2019

(65) Prior Publication Data
US 2020/0340466 A1    Oct. 29, 2020

(30) Foreign Application Priority Data

| Nov. 13, 2017 | (GB) | 1718752 |
| Mar. 27, 2018 | (GB) | 1804937 |
| May 31, 2018 | (GB) | 1808946 |

(51) Int. Cl.
*F04B 37/14* (2006.01)
*F04C 25/02* (2006.01)
(Continued)

(52) U.S. Cl.
CPC ............ *F04B 37/14* (2013.01); *F04B 39/121* (2013.01); *F04B 39/123* (2013.01); *F04B 39/14* (2013.01);
(Continued)

(58) Field of Classification Search
CPC ........ B01D 53/00; F04B 37/14; F04B 39/121; F04B 39/123; F04B 39/14; F04B 41/00
See application file for complete search history.

(56) References Cited

U.S. PATENT DOCUMENTS

| 4,184,810 A | * | 1/1980 | Dyhr | ...................... F04B 29/00 |
| | | | | 417/372 |
| 5,536,317 A | * | 7/1996 | Crain | ................... C08G 61/025 |
| | | | | 118/664 |

(Continued)

FOREIGN PATENT DOCUMENTS

| CN | 102119276 A | 7/2011 |
| CN | 105121698 A | 12/2015 |

(Continued)

OTHER PUBLICATIONS

International Search Report and Written Opinion dated Dec. 21, 2018 received in counterpart International Application No. PCT/GB2018/053244, 12 pp.

(Continued)

*Primary Examiner* — Dominick L Plakkoottam
(74) *Attorney, Agent, or Firm* — Shumaker & Sieffert, P.A.

(57) ABSTRACT

A module for a vacuum pumping and/or abatement system includes a top side, a bottom side, a front side, a rear side, and two opposing lateral sides, which together define a space. The module comprises an apparatus located wholly within the space and one or more connection points coupled to the apparatus. Each of the connection points is for receiving an input for the apparatus or receiving an output from the apparatus. The one or more connection points are located at the top side. The module has a maximum size in a first system dimension that is equal to a first integer multiple of a fixed system value, the first system dimension being a dimension between the lateral sides. For each (Continued)

connection point, a distance between that connection point and each lateral side in the first system dimension is a respective second integer multiple of the fixed system value.

18 Claims, 6 Drawing Sheets

(51) Int. Cl.
| | |
|---|---|
| *F04B 39/14* | (2006.01) |
| *F04C 23/00* | (2006.01) |
| *F04B 41/00* | (2006.01) |
| *F04B 39/12* | (2006.01) |
| *F16L 51/04* | (2006.01) |
| *F16L 53/35* | (2018.01) |
| *F16L 23/08* | (2006.01) |
| *C23C 16/44* | (2006.01) |

(52) U.S. Cl.
CPC .............. *F04B 41/00* (2013.01); *F04C 23/00* (2013.01); *F04C 25/02* (2013.01); *F16L 23/08* (2013.01); *F16L 51/04* (2013.01); *F16L 53/35* (2018.01); *C23C 16/4412* (2013.01); *F04C 2240/30* (2013.01); *F04C 2240/70* (2013.01); *F04C 2240/81* (2013.01)

(56) References Cited

U.S. PATENT DOCUMENTS

| | | | | |
|---|---|---|---|---|
| 5,769,626 | A * | 6/1998 | Hauff | B01D 53/00 417/201 |
| 7,824,500 | B1 * | 11/2010 | Sarver | B08B 15/026 134/8 |
| 8,486,265 | B2 * | 7/2013 | Lin | C02F 9/005 210/241 |
| 2009/0078208 | A1 * | 3/2009 | Hakes | A01K 13/003 119/14.18 |
| 2011/0082580 | A1 | 4/2011 | Philippe et al. | |
| 2012/0189478 | A1 * | 7/2012 | Dreifert | F04C 28/02 418/5 |
| 2012/0261011 | A1 * | 10/2012 | Cho | F04F 5/20 137/565.15 |
| 2013/0276702 | A1 * | 10/2013 | Carlson | B01D 53/38 118/723 I |
| 2015/0260174 | A1 | 9/2015 | Furuta et al. | |
| 2015/0260192 | A1 * | 9/2015 | Iwasaki | B01D 53/005 415/183 |
| 2016/0045860 | A1 | 2/2016 | Stanton | |
| 2017/0049606 | A1 * | 2/2017 | Chen | A61M 16/0057 |
| 2017/0082345 | A1 * | 3/2017 | Espinosa | F25D 23/021 |
| 2017/0288400 | A1 * | 10/2017 | Williams | H02J 3/32 |
| 2018/0226234 | A1 * | 8/2018 | Dickinson | H01J 37/32862 |
| 2018/0306091 | A1 * | 10/2018 | Reichle | F01N 3/2828 |
| 2018/0366307 | A1 * | 12/2018 | Dickinson | H01J 37/32844 |

FOREIGN PATENT DOCUMENTS

| | | |
|---|---|---|
| DE | 10316129 A1 | 4/2006 |
| DE | 202015005199 U1 | 8/2015 |
| DE | 102015121905 A1 | 6/2017 |
| DE | 102016108141 A1 | 11/2017 |
| EP | 1085206 A1 | 3/2001 |
| EP | 2815800 B1 | 8/2018 |

OTHER PUBLICATIONS

Combined Search and Examination Report under Sections 17 and 18(3) dated Oct. 31, 2018 in counterpart GB Application No. 1808946.6, 7 pp.

Translation of the First Office Action and Search Report from counterpart Chinese Application No. 201880073613.4, dated Jul. 2, 2021, 14 pp.

* cited by examiner

MODULE FOR A VACUUM PUMPING AND/OR ABATEMENT SYSTEM

This application is a national stage entry under 35 U.S.C. § 371 of International Application No. PCT/GB2018/053244, filed Nov. 9, 2018, which claims the benefit of GB Application 1808946.6, filed May 31, 2018, GB Application No. 1804937.9, filed Mar. 27, 2018, and GB Application No. 1718752.7, filed Nov. 13, 2017. The entire contents of International Application No. PCT/GB2018/053244 and GB Applications 1808946.6, 1804937.9, and 1718752.7 are incorporated herein by reference.

TECHNICAL FIELD

The present disclosure relates to vacuum pumping and/or abatement systems.

BACKGROUND

Vacuum pumping and abatement systems are used in varied and different technological fields, for example semiconductor fabrication. Typically, in said systems, vacuum pumping equipment is used to pump gas (e.g. gas from an industrial process) out of a particular location, and abatement equipment is used to abate (e.g. destroy or dispose of) undesirable substances (e.g. exhaust gas) which have been produced.

Depending on the processes involved, there may be different criteria for vacuum pumping and abatement. For example, it is typically desirable to use different vacuum pumping equipment and/or different abatement equipment for different processes involving different process gases, different gas pressures, and different gas flow. Also, it is typically desirable to use different abatement equipment to destroy or dispose of different undesirable substances.

Vacuum pumping and abatement systems are typically designed bespoke according to the particular processes with which they will be used. However, the amount of time spent designing, manufacturing and installing such a bespoke system is typically prolonged because different processes require different vacuum pumping and abatement system solutions.

SUMMARY

In a first aspect, there is provided a module for a vacuum pumping and/or abatement system. The module comprises a top side, a bottom side opposite to the top side, a front side, a rear side opposite to the front side, and two opposing lateral sides. The front and rear sides are disposed between the top and bottom sides, and the two opposing lateral sides are disposed between the top and bottom sides and disposed between the front and rear sides. The top, bottom, front, rear, and lateral sides define a space. The module comprises an apparatus located wholly within the space and one or more connection points coupled to the apparatus. Each of the connection points is for receiving an input for the apparatus or receiving an output from the apparatus. The one or more connection points are located at the top side. The module has a maximum size in a first system dimension that is equal to a first integer multiple of a fixed system value, the first system dimension being a dimension between the lateral sides. For each connection point, a distance between that connection point and each lateral side in the first system dimension is a respective second integer multiple of the fixed system value.

The apparatus may be selected from the group of apparatuses consisting of: a vacuum pumping apparatus for pumping a fluid, an abatement apparatus for abating a fluid, a controller configured to control a supply of facilities from the module to other entities remote from the module, and a controller configured to control operation of one or more vacuum pumping and/or abatement apparatuses remote from the module.

The one or more connection points may comprise one or more of the inputs or outputs selected from the group consisting of: a facilities input for receiving facilities from a facilities supply, a facilities output for outputting facilities from the module, a process gas inlet, and a process gas outlet.

The facilities may include one or more facilities selected from the group consisting of: a facilities fluid, electrical power, electrical signals, and optical signals.

The facilities may include facilities fluid selected from the group of facilities fluids consisting of: liquid coolant, city water, de-ionised water, clean dry air, methane, oxygen, nitrogen, and hydrogen.

One or more of the connection points may comprise a connector selected from the group of connectors consisting of: an elbow connector, a reducer connector, a T-connector, a cross connector, a connector comprising a valve, a Y-connector, an electrical connector, and an optical connector.

The module may comprise a plurality of the connection points. For at least one pair of the connection points, a distance between that pair of connection points in a second system dimension may be a respective third integer multiple of the fixed system value. The second system dimension may be perpendicular to the first system dimension.

The common fixed system value may be a value in the range 10 mm-200 cm. The common fixed system value may be 44 mm.

In a second aspect there is provided a vacuum pumping and/or abatement system comprising a plurality of modules, each module being in accordance with the first aspect.

The modules may be arranged one adjacent another in the first system dimension.

A first module of the plurality of modules may comprise a first connection point. A second module of the plurality of modules may comprise a second connection point. The system may further comprise a connection line attached between the first connection point and the second connection point. The connection line may comprise one or more portions aligned along the first system dimension, each of the one or more portions having a length equal to a respective integer multiple of the fixed system value.

A first module of the plurality of modules may comprise a first connection point. A second module of the plurality of modules may comprise a second connection point. A distance between the first connection point and the second connection point in a second system dimension may be an integer multiple of the fixed system value. The second system dimension may be perpendicular to the first system dimension.

The system may further comprise a connection line attached between the first connection point and the second connection point. The connection line may comprise one or more portions aligned along the second system dimension, each of the one or more portions having a length equal to a respective integer multiple of the fixed system value.

A module of the plurality of modules may be a facilities module;

The connection points of the facilities module may comprise one or more facilities inputs configured to receive facilities from a facilities supply and one or more facilities outputs configured to output the received facilities out of the facilities module. The facilities module may comprise one or more facilities connection lines connecting the facilities inputs to the facilities outputs and a controller configured to control supply of facilities received at the facilities inputs out of the facilities outputs, and control operation of one or more vacuum pumping and/or abatement apparatuses remote from the facilities module.

The vacuum pumping and/or abatement system may be an integrated system. The term "integrated system" may be used to refer to two or more modules integrated together into a common system, the modules being selected from the group of modules consisting of: a module comprising vacuum pumping apparatus, a module comprising process gas abatement apparatus, and a module comprising a controller for controlling the vacuum pumping and/or abatement apparatuses.

DETAILED DESCRIPTION

Figure 1:
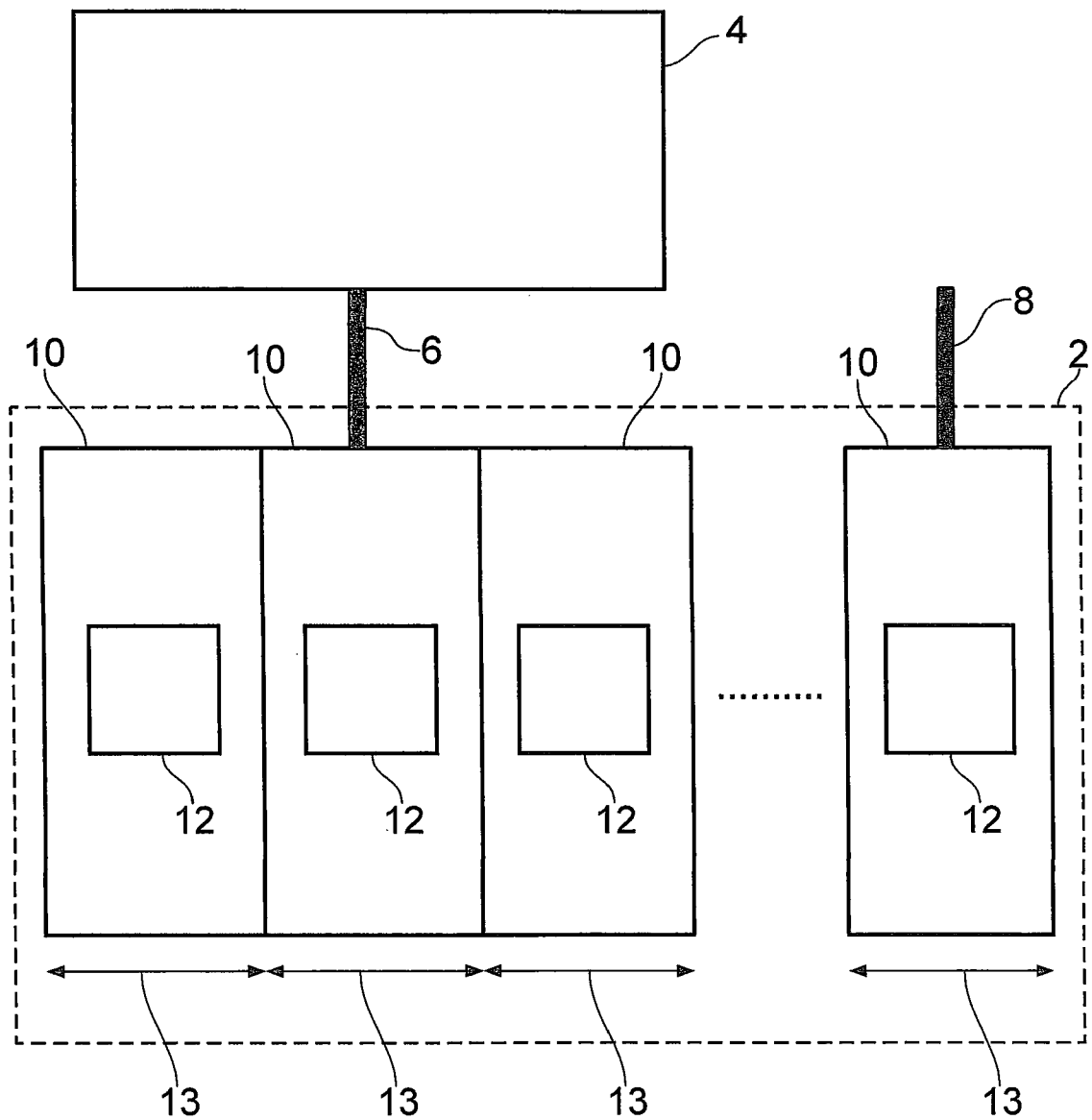
FIG. 1 is a schematic illustration (not to scale) showing a vacuum pumping and/or abatement system.

FIG. 1 is a schematic illustration (not to scale) showing a vacuum pumping and/or abatement system 2. The system 2 is fluidly connected to an entity 4 via a fluid input line 6, commonly referred to as a "foreline", between the system 2 and the entity 4. The entity 4 may, for example, be a chamber or room used in an industrial process such as semiconductor fabrication. The system 2 is also fluidly connected to an exhaust line 8.

In operation, the system 2 pumps gas out of the entity 4 via the fluid input line 6 and/or abates (e.g. destroys or disposes of) undesirable substances produced by the entity 4 which may be present in the pumped gas. The system 2 also pumps exhaust gas (which may be gas which has undergone an abatement process) out of the system 2 into the exhaust line 8, thereby to remove the exhaust gas from the system 2.

The system 2 comprises a plurality of modules 10, which may also be referred to as "units" or "slices". The term "module" is used herein to refer to a discrete part of the system 2 which is removable from the rest of the system 2. Each module 10 comprises one or more apparatuses 12. Each apparatus 12 is configured to perform a respective function within the system 2. For example, an apparatus 12 may be a vacuum pump for pumping gas out of the entity 4, an abatement apparatus for abating undesirable substances produced by the entity 4, an inverter for converting DC electrical power into AC electrical power, or an electronic controller for controlling operation of all or part of the system 2. However, the one or more apparatuses 12 are not limited as such. In general, each of the apparatuses 12 may be any apparatus which is used in a vacuum pumping and/or abatement system. In some embodiments, two or more of the apparatuses 12 are substantially identical and/or perform substantially the same function as each other.

In operation, gas is pumped (i.e. by a vacuum pumping apparatus 12 of one or more of the modules 10) out of the entity 4 via the fluid input line 6, through one or more of the modules 10 (for example, a plurality of the modules 10 as shown in FIG. 1), and subsequently out of the exhaust line 8.

In this embodiment, each module 10 of the system 2 has a width (or other dimension, but for sake of convenience it shall be referred to as a lateral dimension or more simply a 'width') which is equal to an integer multiple of a common system value, hereinafter referred to as "x" (e.g. x, 2x, 3x, 4x, and so on). The widths of the modules 10 are indicated in the Figures by double-headed arrows and the reference numeral 13. In this embodiment, the width 13 of a module 10 is its maximum lateral dimension, and one or more portions of a module 10 may have a lateral size that is less than the (maximum) width 13 of the module 10.

Typically, each module 10 has a width selected from the group of widths consisting of 3x, 8x, 12x, or 15x. However, in some embodiments, one or more modules 10 may have a width that is a different integer multiple of x. For example, the modular system may include one or more modules, each module having a width selected from the groups of widths consisting of: x, 2x, 3x, 4x, 5x, 6x, 7x, 8x, 9x, 10x, 11x, 12x, 13x, 14x, 15x, 16x, 17x, 18x, 19x, 20x, 21x, 22x, 23x, 24x, 25x, 26x, 27x, 28x, 29x, 30x, and greater than 30x.

The value x may be, for example, a value in the range 10 mm-200 cm, or more preferably 10 mm-100 cm, or more preferably 10 mm-90 cm, or more preferably 10 mm-50 cm, or more preferably 10 mm-20 cm, or more preferably 10 mm-10 cm, or more preferably 10 mm-5 cm, or more preferably 20 mm-50 mm, or more preferably 30 mm-40 mm. Example x values include, but are not limited to, 10 mm, 11 mm, 22 mm, 40 mm, 41 mm, 42 mm, 43 mm, 44 mm, 45 mm, 46 mm, 47 mm, 48 mm, 49 mm, 50 mm, 88 mm, 176 mm, 352 mm, 704 mm, 11 cm, 22 cm, 100 cm, 175 cm, 200 cm, etc. Preferably, x is equal to 44 mm or about 44 mm. The exact value chosen for 'x' tends not to be critical and any appropriate value can be chosen.

In this embodiment, the modules 10 have substantially equal heights. The height of the modules 10 is in the range 190-200 cm (e.g. about 198 cm). In this embodiment, the modules 10 have substantially equal depths. The depth of the modules 10 is in the range 130-140 cm (e.g. about 134 cm).

Figure 2:
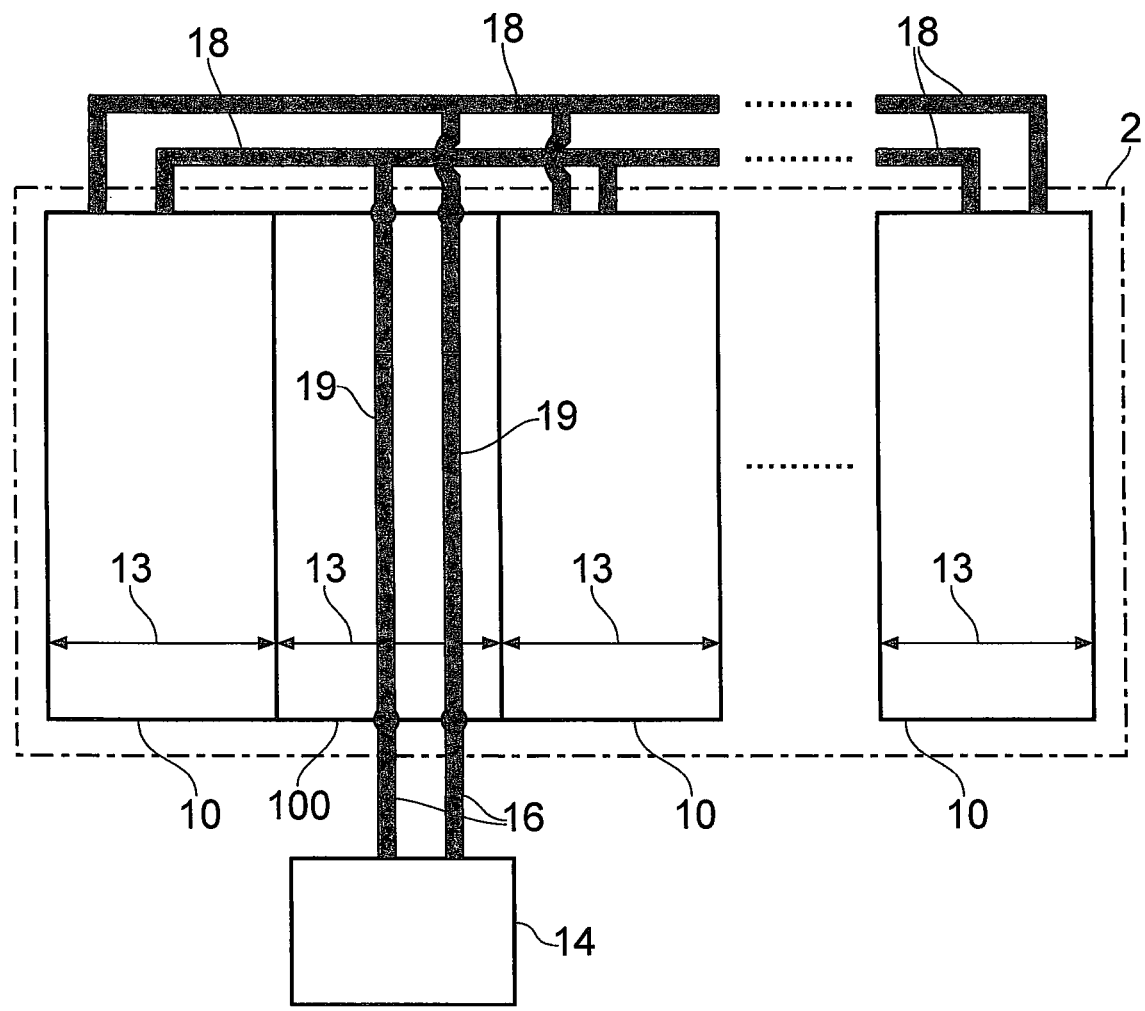
FIG. 2 is a schematic illustration (not to scale) showing facilities lines of the vacuum pumping and/or abatement system.

FIG. 2 is a schematic illustration (not to scale) showing facilities lines of the vacuum pumping and/or abatement system 2. The term "facilities" is used herein to refer to resources which are used by the system 2 to support the main pumping/abatement function of the system 2. These facilities allow the system 2 to operate properly during use. Examples of facilities include facilities fluids (e.g. liquid coolant, city water, de-ionised water, clean dry air, methane, oxygen, nitrogen, hydrogen), electrical power and/or electrical signals carried by electrical connections, and optical signals carried by optical connections (e.g. optical fibres).

The system 2 is connected to a facilities supply 14 by a plurality of facilities input lines 16. In operation, the system 2 receives facilities from the facilities supply 14 via the plurality of facilities input lines 16.

More specifically, the system 2 comprises a facilities module 100 which is connected to the facilities supply 14 by the plurality of facilities input lines 16.

The term "facilities module" is used herein to refer to a particular module of the system 2 at which the facilities used by the system 2 enter the system 2 from the facilities supply 14. In this embodiment, the facilities module 100 does not comprise any vacuum pumping and/or abatement apparatus itself. The facilities module 100 is a type of module 10. In this embodiment, the width 13 of the facilities module 100 is 3x.

The facilities module 100 is connected to other modules 10 of the system 2 by a plurality of facilities distribution lines 18. The facilities input lines 16 are connected to the facilities distribution lines 18 by facilities connection lines 19 of the facilities module 100. The facilities distribution lines 18 may be arranged so that they extend horizontally across the top and rear of the modules 10. The facilities distribution lines may comprise downwardly extending portions or umbilical portions which are each releasably connectable to a particular connection point on a module 10, thereby to supply facilities to each of the modules 10. The umbilical portion may, in turn, extend to the front of the module to ease access for connection thereto.

In operation, the facilities module 100 receives facilities from the facilities supply 14 via the plurality of facilities input lines 16. The received facilities are then conveyed through the facilities module 100, by the facilities connection lines 19 of the facilities module 100, to the facilities distribution lines 18. The facilities are then conveyed, by the facilities distribution lines 18, to the other modules 10 of the system 2, thereby to supply facilities to the other modules 10. In this way, all of the facilities received by the system 2 from the facilities supply 14 enter the system 2 at a single module of the system 2 (i.e. the facilities module 100) and are distributed to the rest of the system 2 from that single module, e.g. by a controller located in the facilities module 100.

The controller in the facilities module 100 may be configured to control supply of facilities received at facilities inputs of the facilities module 100 out of facilities outputs of the facilities module 100, and/or control operation of one or more vacuum pumping and/or abatement apparatuses 12 of one or more other modules 10. The controller may also be configured to control supply of facilities through the system 2 and out of the system 2. For example, the controller may be configured to control flow of facilities fluid through the system 2 such that waste facilities fluid output from the system 2 has a particular temperature.

The facilities input lines 16, the facilities distribution lines 18, and the facilities connection lines 19 are hereinafter generally referred to as the "facilities lines".

Figure 3:
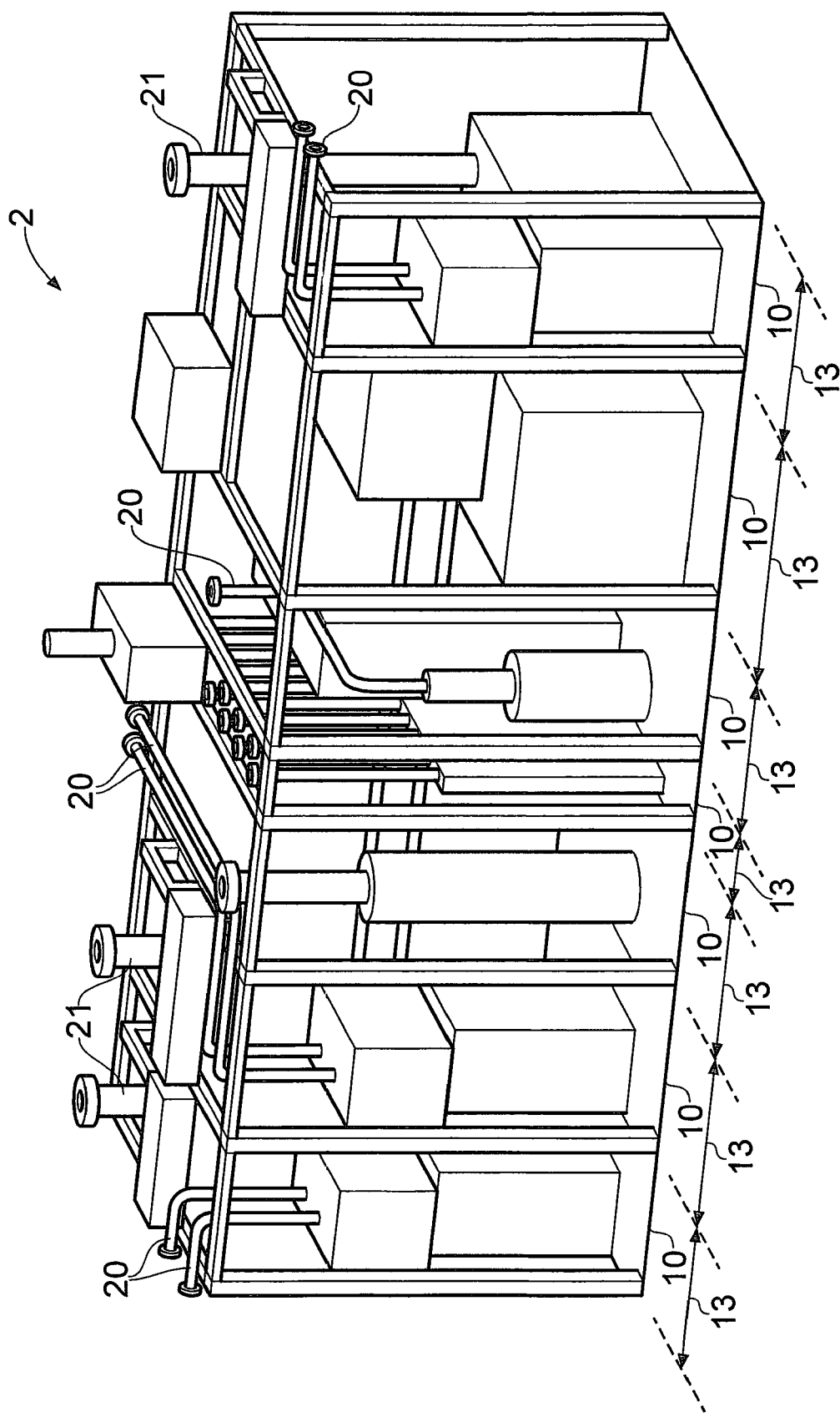
FIG. 3 is a schematic illustration (not to scale) showing a perspective view of the vacuum pumping and/or abatement system.

FIG. 3 is a schematic illustration (not to scale) showing a perspective view of the vacuum pumping and/or abatement system 2. The plurality of modules 10 of the system 2 are positioned in a side-by-side, contiguous arrangement and coupled together to form the system 2. Each module 10 is attached to one or more adjacent modules 10.

The system 2 comprises facilities lines 20 and vacuum pumping and/or abatement lines 21. The facilities lines 20 (e.g. facilities input lines 16, facilities distribution lines 18 and/or facilities connection lines 19 as described above) may include pipes (e.g. metal or polymer pipes) configured to permit the flow of facilities fluid therethrough and/or electrical or optical connections such as wires or optical fibres.

The vacuum pumping and/or abatement lines 21 may include pipes (e.g. metal pipes) configured to permit the flow of pumped gas therethrough.

Figure 4:
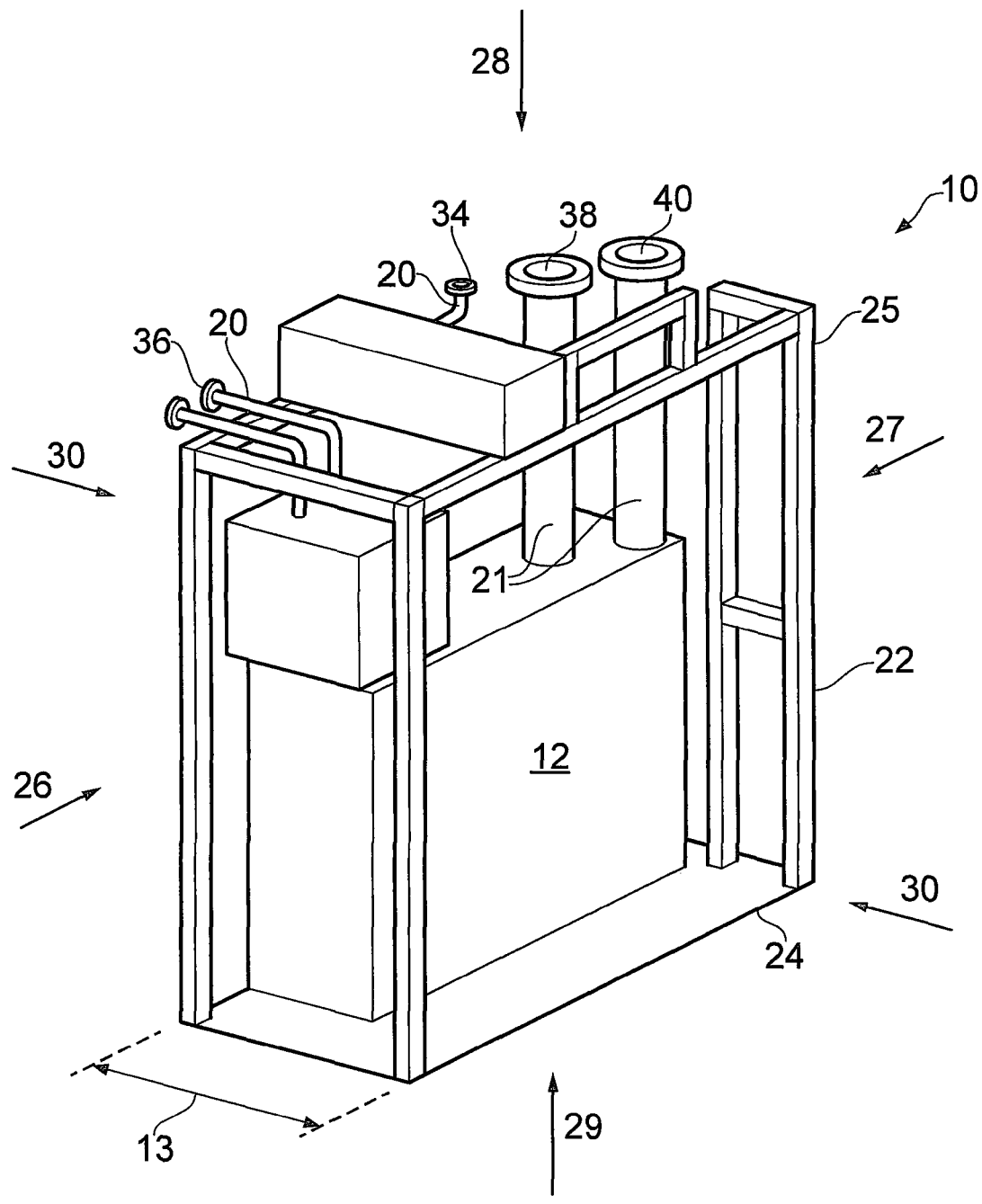
FIG. 4 is a schematic illustration (not to scale) showing a perspective view of a module of the vacuum pumping and/or abatement system.

FIG. 4 is a schematic illustration (not to scale) showing a perspective view of an example module 10 of the vacuum pumping and/or abatement system 2.

The module 10 comprises a frame 22 and one or more apparatuses 12 disposed at least partially within the frame 22. In other words, the frame 22 defines a space and the one or more apparatuses 12 are at least partially disposed within the space. The module 10 also comprises a base 24 coupled to the frame 22. The frame 22 comprises a plurality of interconnected bars 25.

The module 10 has a front side 26, a rear side 27, a top side 28, a bottom side 29, and two opposing lateral sides 30.

The module 10 also comprises facilities lines 20 and vacuum pumping and/or abatement lines 21.

At least some of the facilities lines 20 may be lines which are configured to receive facilities fluid distributed by the facilities module 100, direct the facilities fluid through the module 10, and discharge the facilities fluid out of the module 10 (e.g. to another module or out of the system 2 entirely). At least some of the facilities lines 20 may be lines which are configured to convey electrical power, electrical signals, or optical signals from the facilities module 100 to the module 10.

In this embodiment, the facilities lines 20 of the module 10 include one or more inputs (hereinafter referred to as facilities line inputs and indicated in the Figures by the reference numeral 34) and one or more outputs (hereinafter referred to as facilities line outputs in the Figures by the reference numeral 36).

The facilities line inputs 34 are inputs configured to receive facilities from another module 10, for example from the facilities module 100. The facilities line outputs 36 are outputs configured to output facilities from the module 10 to another module 10 or out of the system 2 entirely. The facilities line inputs 34 and the facilities line outputs 36 are connection points or connectors via which the facilities lines 20 of the module 10 may be connected to other modules 10 of the system 2, for example by means of facilities lines 20 external to the module 10, i.e. via the facilities input lines 16 and/or facilities distribution lines 18. The facilities line inputs 34 and the facilities line outputs 36 may include one or more connectors selected from the group of connectors including, but not limited to, an elbow connector, a reducer connector, a T-connector (or Tee connector), a cross connector (or four-way fitting), a connector comprising a valve, a Y-connector (or wye connector), an electrical connector, and an optical connector.

In this embodiment, as described in more detail later below with reference to FIGS. 5 and 6, the facilities line inputs 34 and the facilities line outputs 36 are located at the top side 28 of the module 10.

The vacuum pumping and/or abatement lines 21 are configured to receive gas pumped from the entity 4, direct the pumped gas through the module 10, and discharge the pumped gas out of the module 10 (e.g. to another module or out of the system 2 entirely).

In this embodiment, the vacuum pumping and/or abatement lines 21 include one or more inputs (hereinafter referred to as process gas line inputs and indicated in the Figures by the reference numeral 38) and one or more outputs (hereinafter referred to as process gas line outputs in the Figures by the reference numeral 40).

The process gas line inputs 38 are inputs configured to receive process gas from the entity 4 or another module 10.

The process gas line outputs 40 are outputs configured to output process gas from the module 10 to another module 10 or out of the system 2 entirely. The process gas line inputs 38 and the process gas line outputs 40 are connection points or connectors via which the vacuum pumping and/or abatement lines 21 of the module 10 may be connected to other modules 10 of the system 2, for example by means of vacuum pumping and/or abatement lines 21 external to the module 10. The process gas line inputs 38 and the process gas line outputs 40 may include one or more connectors selected from the group of connectors including, but not limited to, an elbow connector, a reducer connector, a T-connector (or Tee connector), a cross connector (or four-way fitting), a connector comprising a valve, or a Y-connector (or wye connector).

In this embodiment, as described in more detail later below with reference to FIGS. 5 and 6, the process gas line inputs 38 and the process gas line outputs 40 are located at the top side 28 of the module 10.

Figure 5:
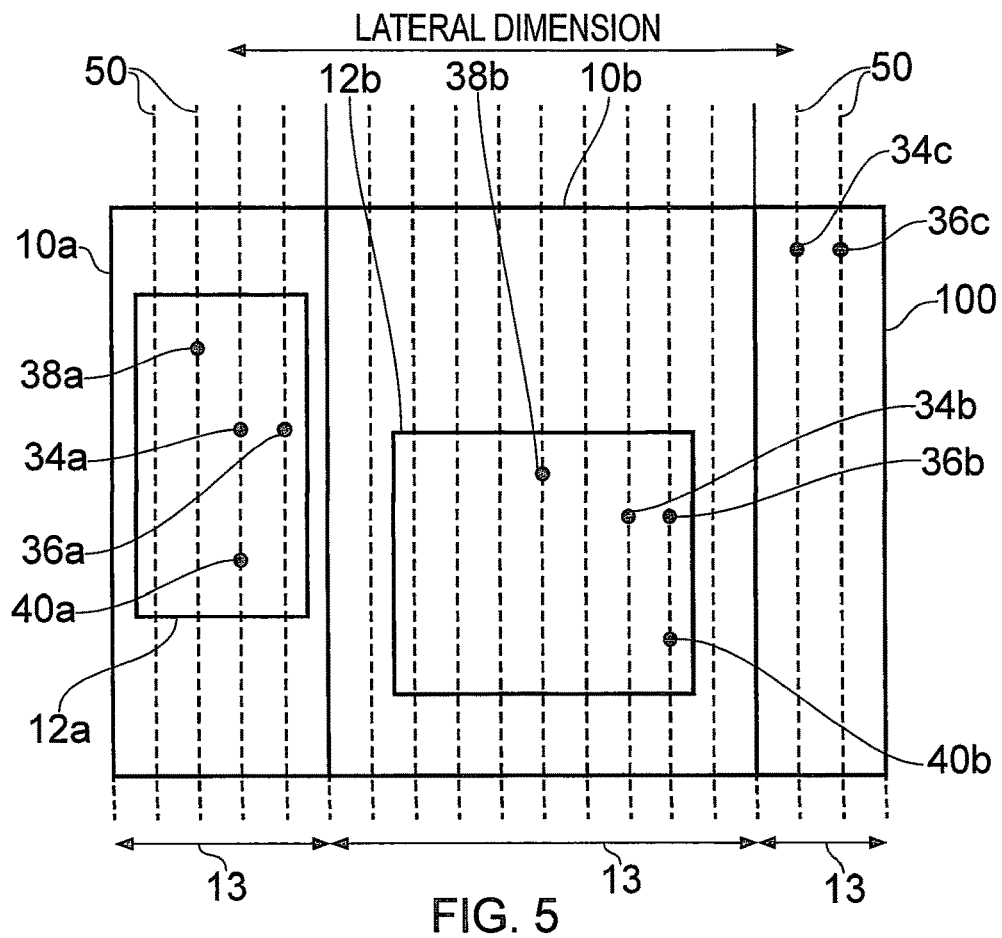
FIGS. 5 and 6 are a schematic illustration (not to scale) showing top down views of a part of the vacuum pumping and/or abatement system for the purpose of describing positioning of connection points of the modules of the system.

FIG. 5 is a schematic illustration (not to scale) showing a top down view of a part of the system 2 for the purpose of describing the positioning of the connection points (i.e. the one or more facilities line inputs 34, the one or more facilities line outputs 36, the one or more process gas line inputs 38, and the one or more process gas line outputs 40) of a module 10 or modules for connection with other modules 10 in the system 2.

The part of the system 2 shown in FIG. 5 includes, for explanatory purposes, a first module 10a, a second module 10b, and the facilities module 100. The first module 10a includes a first vacuum pumping and/or abatement apparatus 12a. The second module 10b includes a second vacuum pumping and/or abatement apparatus 12b. The facilities module 100 is for supplying facilities to the first and second apparatuses 12a, 12b.

In this embodiment, the modules 10a, 10b, 100 include various connection points denoted by respective solid circles in the modules 10a, 10b, 100. In particular, the first module 10a comprises a first facilities line input 34a, a first facilities line output 36a, a first process gas line input 38a, and a first process gas line output 40a. The second module 10b comprises a second facilities line input 34b, a second facilities line output 36b, a second process gas line input 38b, and a second process gas line output 40b. The facilities module 100 comprises a third facilities line input 34c, and a third facilities line output 36c.

The connection points 34a-c, 36a-c, 38a-b, 40a-b are located on so-called first "x-lines" shown as vertical dotted lines in FIG. 5 across the modules 10a, 10b, 100 and the system 2 as a whole. Some of the first x-lines are labelled using the reference numeral 50. In this embodiment, the first x-lines 50 are lines which are substantially perpendicular to the lateral dimension (i.e. the widths 13 of the modules 10a, 10b, 100), and are spaced apart from each other by a distance of x. As noted above, the value x may be, for example, a value in the range 10 mm-200 cm, or more preferably 44 mm or about 44 mm. The exact value chosen for 'x' tends not to be critical and any appropriate value can be chosen.

Furthermore, the lateral sides 30 of the modules 10a, 10b, 100 are aligned along respective first x-lines 50.

The connection points 34a-c, 36a-c, 38a-b, 40a-b being located on the first "x-lines" tends to provide that the distance between any two connection points 34a-c, 36a-c, 38a-b, 40a-b in the lateral dimension is an integer multiple of the value x. By way of example, the exhaust point/connector 40a of the first apparatus 12a (which may be a vacuum pumping apparatus) for exhausting process gas is connected to inlet point/connector 38b of the second apparatus 12b (which may be an abatement unit for abating the process gas) by a distance in the lateral dimension of 7x (or seven times the fixed system value). As a further example, the facilities line output 36c of the facilities module 100 is connected to the first facilities line input 34a of the first apparatus 12a by a distance in the lateral dimension of 14x, and to the second facilities line input 34b of the second apparatus 12b by a distance in the lateral dimension of 5x.

The lateral sides 30 of the modules 10a, 10b, 100 being aligned along respective first x-lines 50, and the connection points 34a-c, 36a-c, 38a-b, 40a-b being located on the first "x-lines" tends to provide that the distance between a connection point 34a-c, 36a-c, 38a-b, 40a-b and a lateral side 30 of a module in the lateral dimension is an integer multiple of the value x. For example, the distance between a connection point and the sides of the module in which that connection point is located in the lateral dimension is an integer multiple of the value x. By way of example, the facilities line input and output 34c, 36c of the facilities module 100 are spaced apart from respective lateral sides 30 of the facilities module 100 by a distance in the lateral dimension of x.

Figure 6:
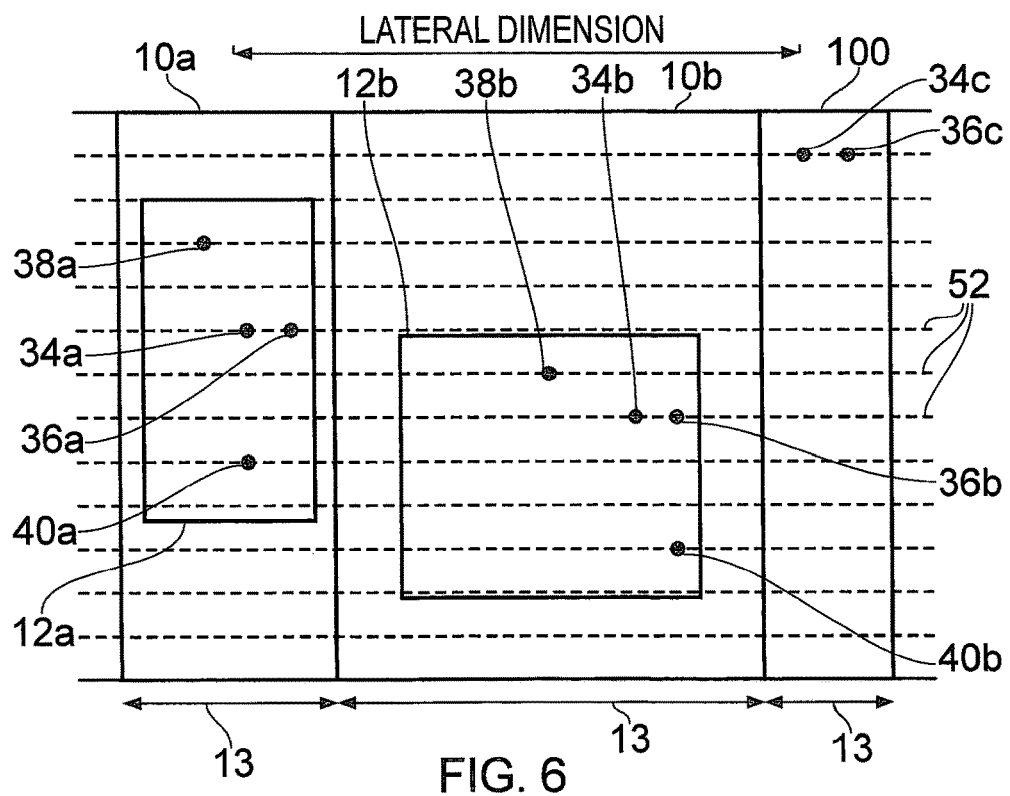

FIG. 6 is a schematic illustration (not to scale) showing a top down view of a part of the system 2 for the purpose of describing the positioning of the connection points 34, 36, 38, 40 of a module 10 or modules for connection with other modules 10 in the system 2.

In this embodiment, the connection points 34a-c, 36a-c, 38a-b, 40a-b are located on second "x-lines" shown as horizontal dotted lines in FIG. 6 across the modules 10a, 10b, 100 and the system 2 as a whole. Some of the second x-lines are labelled using the reference numeral 52. In this embodiment, the second x-lines 52 are lines which are substantially parallel to the lateral dimension (i.e. the widths 13 of the modules 10a, 10b, 100), and are spaced apart from each other by a distance of x.

The connection points 34a-c, 36a-c, 38a-b, 40a-b being located on the second "x-lines" tends to provide that the distance between any two connection points 34a-c, 36a-c, 38a-b, 40a-b in a direction perpendicular to the lateral dimension is an integer multiple of the value x. By way of example, the exhaust point/connector 40a of the first apparatus 12a for exhausting process gas is connected to inlet point/connector 38b of the second apparatus 12b by a distance in the direction perpendicular to the lateral dimension of 2x.

In some embodiments, the front and rear sides 26, 27 of the modules 10a, 10b, 100 are aligned along second x-lines 52.

The connection points or connectors 34a-c, 36a-c, 38a-b, 40a-b of the modules 10 being located, in the installed system 2, along the first and second x-lines tends to facilitate the connection together of those connection points. Two connections points may be connected together by connection lines which form a path along one or more first x-lines and/or one or more second x-lines. The lengths of the connection lines (e.g. the pipes, conduits, power lines, or anything else that is used in the vacuum pumping and/or abatement system) needed to connect together the connection points of different modules tend to be integer multiples of the same predetermined common system value x. For example, the facilities line output 36c of the facilities module 100 may be connected to the facilities input 34a of the first module 10a by a connection line having a first component of length 14x which travels in the lateral direction and a second component extending perpendicularly from one end of the first component and having length 4x. Advantageously, this tends to allow for the pre-manufacture of standardised connections lines, which tends to reduce assembly/installation time and cost. Furthermore, sections of connection lines for connecting the modules can be configured in advance of system installation thereby to further reduce installation time.

Figure 7:
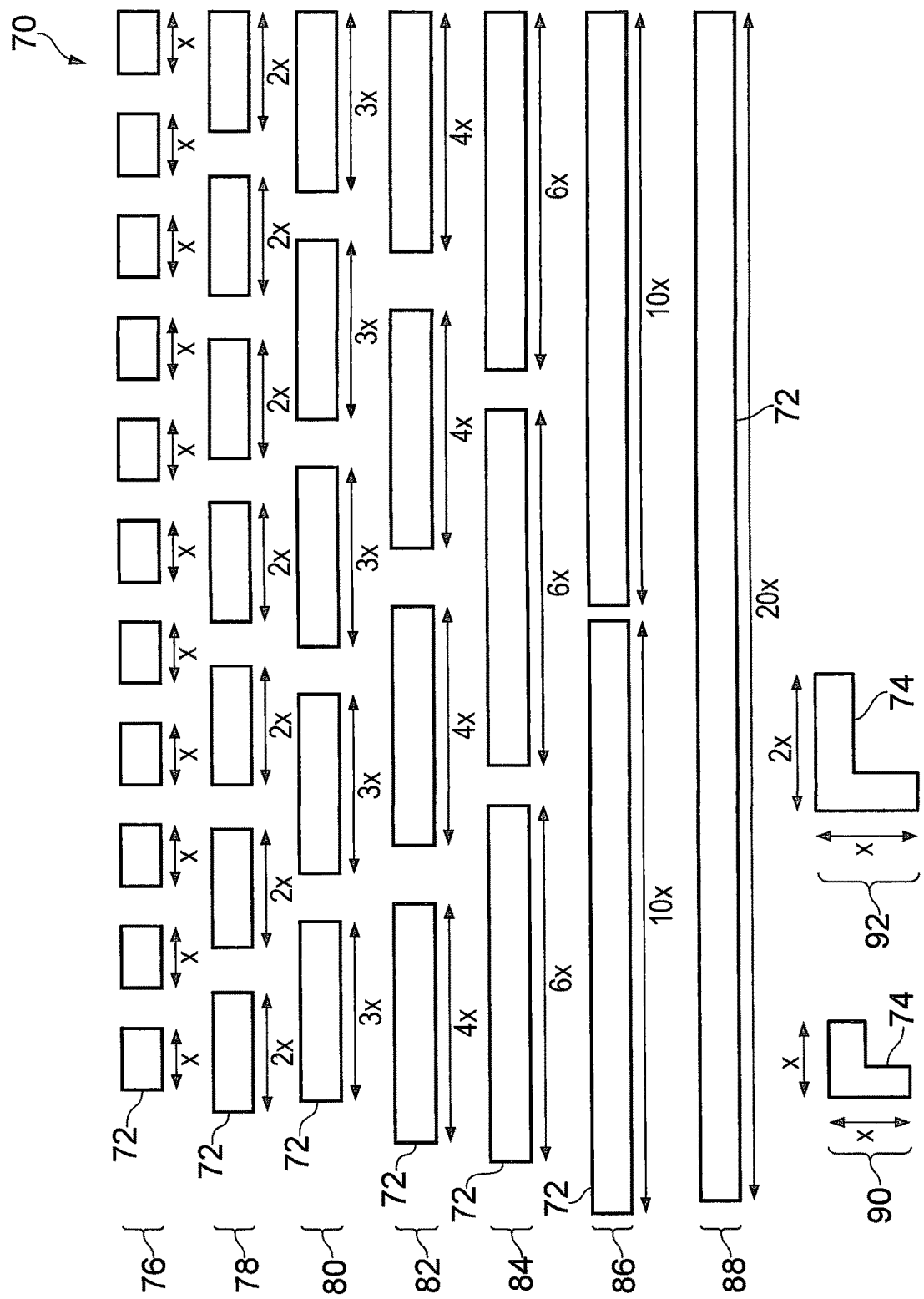
FIG. 7 is a schematic illustration (not to scale) showing an example set of connection lines for connecting together the modules of the vacuum pumping and/or abatement system.

By way of example, a set of standardised connections lines for connecting together the connection points of different modules 10 will now be described. FIG. 7 is a schematic illustration (not to scale) showing an example set 70 of connection lines. The set 70 comprises a plurality of substantially straight connection lines 72, and a plurality of corner or "bend" connection lines 74.

The connection lines 72, 74 may include, for example, pipes for conveying fluid, housings (e.g. tubes) for containing electrical conductors or optical fibres, electrical conductors, and optical fibres.

In some embodiments, at least some of the connection lines 72, 74 of the set 70 are substantially rigid.

The straight connection lines 72 provide a plurality of discrete connection components. In this embodiment, each of the straight connection lines 72 has a length that is substantially equal to an integer multiple of the common system value x. The straight connection lines 72 are grouped into different groups, each group containing straight connection lines 72 of a respective length. A first group 76 includes those straight connection lines 72 that have a length equal to x. A second group 78 includes those straight connection lines 72 that have a length equal to 2x. A third group 80 includes those straight connection lines 72 that have a length equal to 3x. A fourth group 82 includes those straight connection lines 72 that have a length equal to 4x. A fifth group 84 includes those straight connection lines 72 that have a length equal to 6x. A sixth group 86 includes those straight connection lines 72 that have a length equal to 10x. A seventh group 88 includes those straight connection lines 72 that have a length equal to 20x. In other embodiments, straight connection lines having lengths that are a different integer multiple of the common system value x may be used. For example, straight connection lines having lengths equal to x, 2x, 3x, 4x, 5x, 7x, 8x, 9x, 10x, 11x, 12x, 13x, 14x, 15x, 16x, 17x, 18, 19x, 20x, and/or more than 20x may be used.

The corner connection lines 74 provide a plurality of discrete connection components. The corner connection lines 74 may be right-angled as shown or may subtend other angles greater or less than 90°. In this embodiment, each corner connection line 74 comprises two straight portions (which may be of equal length or of different length) coupled at a corner. In this embodiment, each of the straight portions of each of the corner connection lines 74 has a length that is substantially equal to an integer multiple of the common system value x. The corner connection lines 74 are grouped into different groups, each group containing corner connection lines 74 having substantially the same size and shape. An eighth group 90 includes those corner connection lines 74 that have a first straight portion of length x and a second straight portion of length x. A ninth group 92 includes those corner connection lines 74 that have a first straight portion of length x and a second straight portion of length 2x. Preferably, there are provided a plurality of differently sized corner components connection lines 74. In other embodiments, corner connection lines having straight portions having lengths that are a different integer multiple of the common system value x may be used. For example, corner connection lines may have straight portions, each straight portion having a length selected from the group of lengths consisting of x, 2x, 3x, 4x, 5x, 7x, 8x, 9x, 10x, 11x, 12x, 13x, 14x, 15x, 16x, 17x, 18, 19x, 20x, and/or more than 20x.

The corner connection lines 74 may be used to connect other components (e.g. straight connection lines 72) which are not aligned or are at an angle to each other.

Advantageously, a connection line of a desired length (the desired length being an integer multiple of the common system value x) may be provided by selecting appropriate connection lines 72, 74 from the groups 76-92 and connecting those selected connection lines 72, 74 together to provide a connection line having a total length equal to the desired length.

Thus, a modular system for constructing a vacuum pumping and/or abatement system is provided.

Advantageously, modules and connection lines can be easily and efficiently arranged and attached together to provide multiple different system configurations, thereby to readily meet different vacuum pumping and/or abatement requirements.

The modules, connectors, and connection lines can be manufactured and prepared in advance of the system being designed and installed, thereby reducing cost and lead time.

The space (or footprint) occupied by an installed vacuum pumping and/or abatement system tends to be an important factor in system design. A reduced footprint tends to lead to decreased costs and/or greater productivity. Advantageously, with the above-described modular system, each module and connection line can be designed, manufactured and assembled in advance of system definition and installation, and, when installed, occupies a defined space in the installed system. This approach tends to provide for reduced footprint of the overall system. Furthermore, predictability of the total footprint of the system is improved.

Advantageously, the facilities module described above tends to allow all of the facilities used by a vacuum pumping and/or abatement system to enter the system at a single location (i.e. the facilities module). This tends to allow installation or assembly of the system to be performed more easily, since a user of the system can connect their facilities supply to the system at one known location, rather than at multiple different locations.

Advantageously, the facilities module and connection lines described above tend to allow for easy connection of the facilities outputs of the facilities module to other modules of the system.

In the above embodiments, the heights of all of the modules are substantially equal to each other and may be, for example 190 cm-200 cm, e.g. about 198 cm. When installed in a system, the height of a module may be greater than 198 cm, for example due to connection lines extending from a top of the module to connect that module to other modules. In some embodiments, one or more of the modules has a different height to one or more of the other modules. Also, in some embodiments, one or more (e.g. all) of the modules has a height other than 190 cm-200 cm. Preferably, each of the modules has a height that is substantially equal to an integer multiple of some common value, e.g. the common system value x or a value y that is different to x.

In the above embodiments, the depths of all of the modules are substantially equal to each other and may be, for example 130 cm-140 cm, e.g. about 134 cm. However, in other embodiments, one or more of the modules has a different depth to one or more of the other modules. Also, in some embodiments, one or more (e.g. all) of the modules has a depth other than 130 cm-140 cm. Preferably, each of the modules has a depth that is substantially equal to an integer multiple of some common value, e.g. the common system value x, the value y, or a value z that is different to x and y.

In the above embodiments, the set of connection lines comprises straight connection lines and corner connection lines. However, in other embodiments the modular system includes different shape connection lines instead of or in additional to one or more of the straight connection lines and corner connection lines. Examples of other connection lines that may be included in the modular system include, but are not limited to, S-bend components, rectilinear connection lines, and at least partially flexible connection lines (e.g. a hose).

In the above embodiments, the set of connection lines comprises connection lines having the lengths and shapes described above with reference to FIG. 7. However, in other embodiments, the set of connection lines may comprise connection lines having different lengths instead of or in addition to one or more of those connection lines shown in FIG. 7 and described in more detail above. For example, it may be determined that a connection line that is frequently used in an installed system has a length of 7x, 11x, 15x, or some other multiple of x, and in this case it may be desirable to manufacture connection lines having that length. It may be desirable to reduce the number of groups of differently sized connection lines. For example, it may not be desirable to produce connection lines having lengths of 6x, since such lines can be readily provided by joining components of, e.g., 3x. In embodiments in which connection lines include a seal carrier, preferably the lengths of those connection lines include any seal carrier.

Also, in some embodiments, the set of connection lines may include one or more connection lines that have a length that is not an integer multiple of the common system value x. Bespoke components not based on the value x can, where required, be manufactured for any installed system. For example, corner connection and/or flexible gas conduits having lengths not based the value x may be used during installation for connecting adjacent connection lines. This advantageously tends to provide additional configurability of the system where desired, even whilst much of the system is pre-configured based on the common system value x.

In the above embodiments, the modules are arranged and connected together as described in more detail earlier above. In particular, the modules are connected together in a side-by-side, contiguous arrangement, each module being attached to one or more adjacent modules at one or both of its lateral sides. However, in other embodiments, the modules may be positioned or arranged, and connected together in a different way. For examples, in some embodiments, spaces or gaps exist between adjacent modules. Such spaces may facilitate access by a user, e.g. for performing servicing or maintenance operations. Preferably, the sizes of the spaces or gaps between adjacent modules are an integer multiple of the common system value x. This tends to facilitate connection between the spaced apart modules by the connection lines. In some embodiments, one or more modules may be attached to one or more adjacent modules at a side other than one of its lateral sides. For example, in some embodiments, a module is attached to a different module at its rear side.

In the above embodiments, the connection points of the modules are located at or proximate to the top sides of those modules. However, in other embodiments, one or more of the connections points of one or more of the modules is located at or proximate to a different side, e.g. the rear side.

In the above embodiment, the connection points of the modules are located along the first and second x-lines. However, in other embodiments, one or more of the connection points is not located along one of the second x-lines.

The invention claimed is:

1. A module for a vacuum pumping and/or abatement system, the module comprising:
   a top side and a bottom side opposite to the top side;
   a front side and a rear side opposite to the front side, the front and rear sides disposed between the top and bottom sides;
   two opposing lateral sides disposed between the top and bottom sides and disposed between the front and rear sides, wherein the top, bottom, front, rear, and lateral sides define a space;
   an apparatus located wholly within the space; and
   one or more connection points coupled to the apparatus, each connection point of the one or more connection points configured to receive an input for the apparatus or configured to receive an output from the apparatus;
   wherein
   the one or more connection points are located at the top side;
   the module has a maximum size in a first system dimension that is equal to a first integer multiple of a common fixed system value, the first system dimension being a dimension between the two opposing lateral sides;
   for each connection point, a respective distance between a respective connection point and a respective lateral side is a respective second integer multiple of the common fixed system value; and
   the common fixed system value is a value in the range 10 millimeters (mm)-200 centimeters (cm).

2. The module of claim 1, wherein the apparatus is selected from the group of apparatuses consisting of: a vacuum pumping apparatus for pumping a fluid, an abatement apparatus for abating a fluid, a controller configured to control a supply of facilities from the module to other entities remote from the module, and a controller configured to control operation of one or more vacuum pumping and/or abatement apparatuses remote from the module.

3. The module of claim 1, wherein the one or more connection points comprise one or more of the inputs or outputs selected from the group consisting of: a facilities input configured to receive facilities from a facilities supply, a facilities output configured to output facilities from the module, a process gas inlet, and a process gas outlet.

4. The module of claim 2, wherein the facilities include one or more facilities selected from the group consisting of: a facilities fluid, electrical power, electrical signals, and optical signals.

5. The module of claim 4, wherein the facilities include facilities fluid selected from the group of facilities fluids consisting of: liquid coolant, city water, de-ionised water, clean dry air, methane, oxygen, nitrogen, and hydrogen.

6. The module of claim 1, wherein the one or more of the connection points comprises a connector selected from a group of connectors consisting of: an elbow connector, a reducer connector, a T-connector, a cross connector, a connector comprising a valve, a Y-connector, an electrical connector, and an optical connector.

7. The module of claim 1, wherein:
   the module comprises a plurality of the connection points;
   for at least one pair of the connection points, a distance between connection points of that pair of connection points in a second system dimension is a respective third integer multiple of the common fixed system value; and the second system dimension is perpendicular to the first system dimension.

8. The module of claim 1, wherein the common fixed system value is 44 mm.

9. A vacuum pumping and/or abatement system comprising a plurality of modules, each module comprising:
- a top side and a bottom side opposite to the top side;
- a front side and a rear side opposite to the front side, the front and rear sides disposed between the top and bottom sides;
- two opposing lateral sides disposed between the top and bottom sides and disposed between the front and rear sides, wherein the top, bottom, front, rear, and lateral sides define a space;
- an apparatus located wholly within the space; and
- one or more connection points coupled to the apparatus, each connection point of the one or more connection points configured to receive an input for the apparatus or configured to receive an output from the apparatus; wherein
  - the one or more connection points are located at the top side;
  - the module has a maximum size in a first system dimension that is equal to a first integer multiple of a common fixed system value, the first system dimension being a dimension between the two opposing lateral sides;
  - for each connection point, a respective distance between a respective connection point and a respective lateral side is a respective second integer multiple of the common fixed system value; and
  - the common fixed system value is a value in the range 10 millimeters (mm)-200 centimeters (cm).

10. The vacuum pumping and/or abatement system of claim 9, wherein the modules are arranged one adjacent another in the first system dimension.

11. The vacuum pumping and/or abatement system of claim 9, wherein:
- a first module of the plurality of modules comprises a first connection point of the one or more connection points;
- a second module of the plurality of modules comprises a second connection point of the one or more connection points; and
- the system further comprises a connection line attached between the first connection point and the second connection point; wherein
  - the connection line comprises one or more portions aligned along the first system dimension, each of the one or more portions having a length equal to a respective integer multiple of the common fixed system value.

12. The vacuum pumping and/or abatement system of claim 9, wherein:
- a first module of the plurality of modules comprises a first connection point of the one or more connection points;
- a second module of the plurality of modules comprises a second connection point of the one or more connection points;
- a distance between the first connection point and the second connection point in a second system dimension is an integer multiple of the common fixed system value; and
- the second system dimension is perpendicular to the first system dimension.

13. The vacuum pumping and/or abatement system of claim 12, wherein:
- the system further comprises a connection line attached between the first connection point and the second connection point; wherein
  - the connection line comprises one or more portions aligned along the second system dimension, each of the one or more portions having a length equal to a respective integer multiple of the common fixed system value.

14. The vacuum pumping and/or abatement system of claim 9, wherein
- a module of the plurality of modules is a facilities module;
- the one or more connection points of the facilities module comprises:
  - one or more facilities inputs configured to receive facilities from a facilities supply; and
  - one or more facilities outputs configured to output the received facilities out of the facilities module; and
- the facilities module comprises:
  - one or more facilities connection lines connecting the facilities inputs to the facilities outputs; and
  - a controller configured to control supply of facilities received at the facilities inputs out of the facilities outputs, and control operation of one or more vacuum pumping and/or abatement apparatuses remote from the facilities module.

15. The module of claim 1, wherein the common fixed system value is a value in the range 10 mm-5 cm.

16. The module of claim 1, wherein the common fixed system value is a value in the range 20 mm-50 mm.

17. The vacuum pumping and/or abatement system of claim 9, wherein the common fixed system value is a value in the range 10 mm-5 cm.

18. The vacuum pumping and/or abatement system of claim 9, wherein the common fixed system value is a value in the range 20 mm-50 mm.

* * * * *